March 17, 1964 R. R. STONE, JR., ETAL 3,125,729
DIGIT CONTROL FREQUENCY SYNTHESIZER
Filed Dec. 31, 1958 2 Sheets-Sheet 1

INVENTOR
ROBERT R. STONE, JR.
HARRIS F. HASTINGS
BY Richard C. Reed
ATTORNEY

March 17, 1964 R. R. STONE, JR., ETAL 3,125,729

DIGIT CONTROL FREQUENCY SYNTHESIZER

Filed Dec. 31, 1958 2 Sheets-Sheet 2

INVENTOR
ROBERT R. STONE., JR.
HARRIS F. HASTINGS

BY Richard C. Reed

ATTORNEY

United States Patent Office 3,125,729

Patented Mar. 17, 1964

3,125,729

DIGIT CONTROL FREQUENCY SYNTHESIZER

Robert R. Stone, Jr., 55 Belfast Drive, Rosecroft Park 22, Md., and Harris F. Hastings, 3017 Park Drive SE., Washington, D.C.

Filed Dec. 31, 1958, Ser. No. 784,405
8 Claims. (Cl. 331—39)
(Granted under Title 35, U.S. Code (1952), sec. 266)

Figure 1:
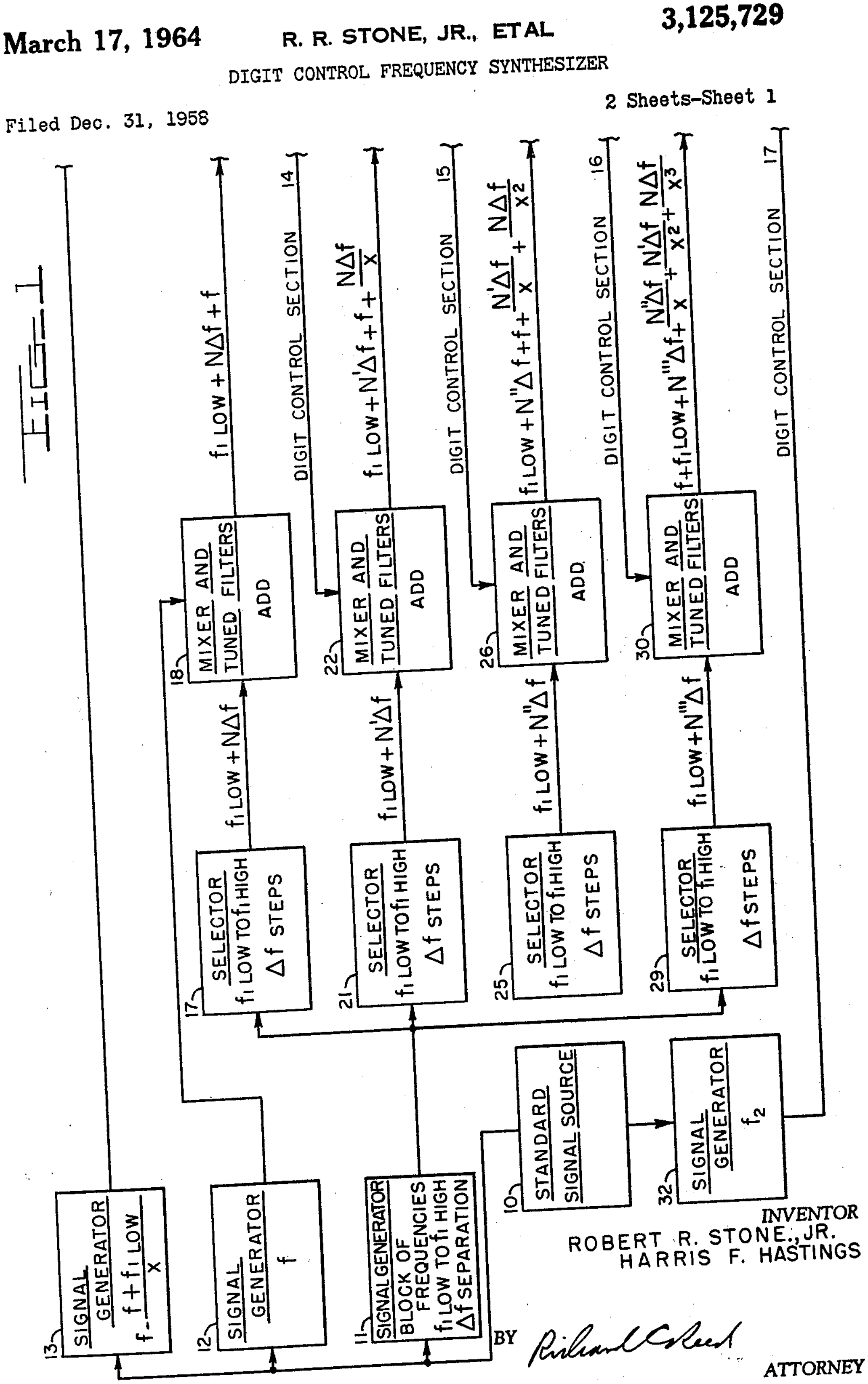

The invention described herein may be manufactured and used by or for the Government of the United States of America for governmental purposes without the payment of any royalties thereon or therefor.

The present invention relates in general to a signal generator and in particular to a frequency synthesizer for generating any desired signal within an extremely wide range of frequencies.

In many applications of electronics, such as frequency measurements and control, it is desirable to have a frequency synthesizer which is very precise and capable of being set to a predetermined frequency easily and rapidly. Synthesizers are known wherein a number of a decimally related groups of harmonics are generated in response to the output of a master oscillator. Certain ones of each group, being selected by suitable filtering means, are applied to a series of mixers, each of which combines a pair of decimally adjacent frequencies to produce a resultant frequency which is recombined with a further one of the harmonic frequencies and a further mixer to provide a further resultant frequency. This process of harmonic selection and frequency recombinations is continued until the ultimately desired frequency is formed. Since the filters associated with each of the mixers must reject unwanted frequencies, it is necessary that the arrangement of frequencies used in the synthesization be such that the extraneous beats or modulations produced can be easily filtered. Because of filtering limitations, this is a major drawback when small incremental changes in frequency output are required. In other systems, an additional variable oscillator is added to produce the low order increments (usually from 1 kc. down to 1 cycle). At high frequencies, the errors in the variable oscillator are small compared to the lowest frequency increment. However, as the frequency is decreased, the percent error becomes more and more appreciable which in certain applications may be a serious disadvantage.

Accordingly, it is an object of the present invention to provide a frequency synthesizer capable of producing increments in the output frequency in the smallest steps desired, the output frequency in each step having the same accuracy as the driving source.

Another object is the provision of a synthesizer capable of producing extremely small increments in the frequency of the output signal without the introduction of objectionable sidebands.

Another object of the present invention is to provide a frequency synthesizer in which the frequency range of the output signal can be increased by the addition of a digit control section which is interchangeable with other digit control sections employed in the frequency synthesizer.

A further object is to provide a frequency synthesizer in which signals having the same fixed frequencies, obtained from a single driving source, are applied to each digit control section.

Figure 2:
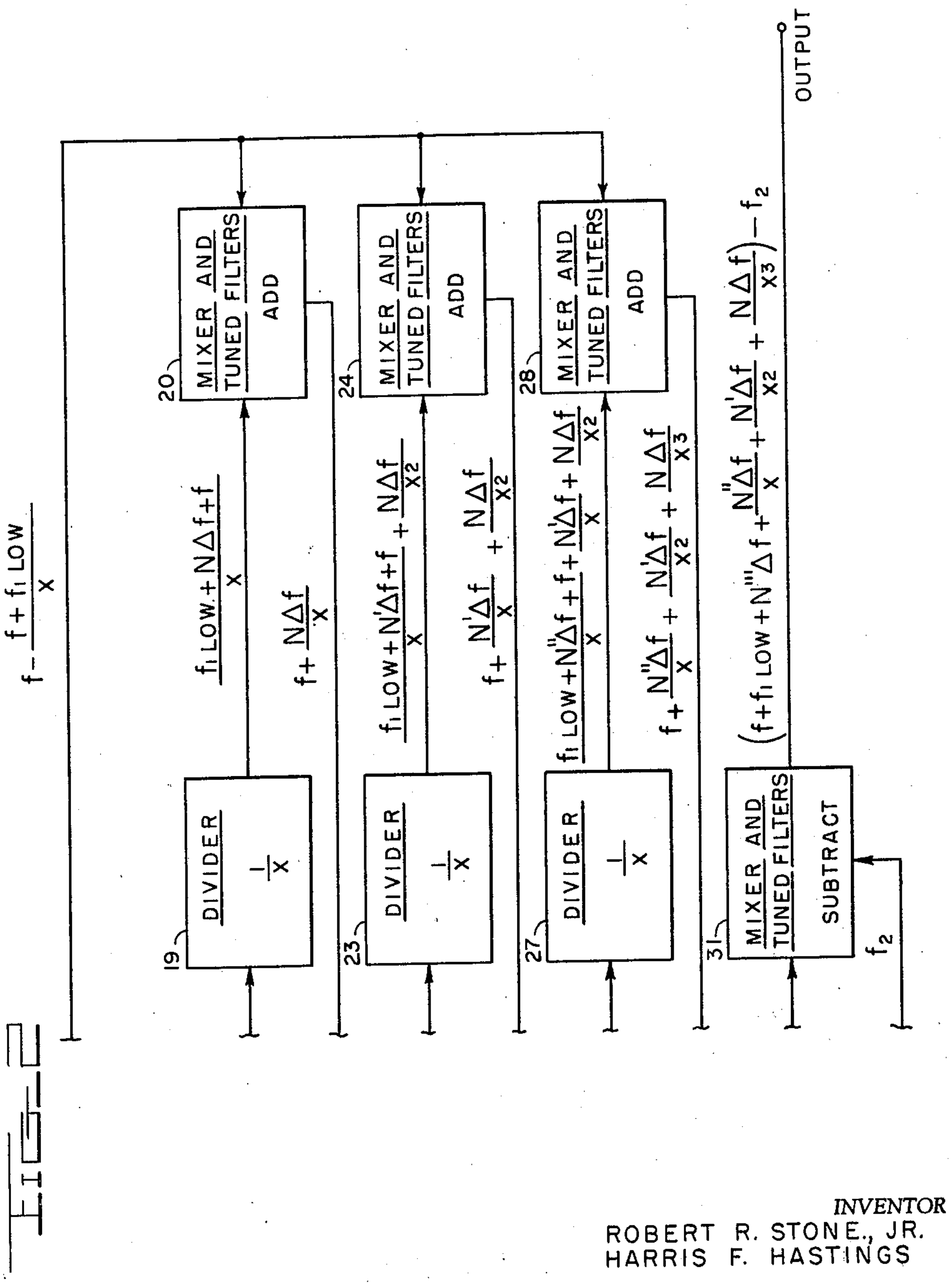

With these and other objects in view, as will hereinafter more fully appear, and which will be more particularly pointed out in the appended claims, reference is now made to the following description taken in connection with the accompanying drawings in which:

FIGS. 1 and 2 disclose a preferred embodiment of the present invention.

Briefly, a frequency synthesizer is provided which utilizes a plurality of digit control sections, each including, a first mixer and tuned filters, a divider, and a second mixer and tuned filters connected in cascade. The digit control sections in turn are connected in cascade in such a manner that the output of the second mixer and tuned filters in each digit control section is connected to the first mixer and tuned filters in the succeeding control section. Selected fixed frequencies are applied to the first and second mixer and tuned filters and a block of frequencies, having values that vary in predetermined steps, is applied to respective selectors in each control section. In the arrangement described, by selecting a desired step in the block of frequencies, each selector controls the values of a digit in a numeral representing the frequency of a signal formed, and the number of interchangeable digit control sections connected in cascade determines the number of places, and thus the range of frequencies, that may be synthesized. The unwanted frequencies that are generated in forming a desired signal are eliminated by means of the tuned filters and divider in each digit control section.

Referring to FIGS. 1 and 2, the output of standard signal source 10 drives signal generators 11, 12 and 13 to provide signals that are applied to digit control sections 14 to 17. Digit control section 14 consists of mixer and tuned filters 18, divider 19 and mixer and tuned filters 20 connected in cascade; digit control section 15 consists of mixer and tuned filters 22, divider 23 and mixer and tuned filters 24 connected in cascade; digit control section 16 consists of mixer and tuned filters 26, divider 27 and mixer and tuned filters 28 connected in cascade; and finally, digit control section 17 consists of mixer and tuned filters 30 and mixer and tuned filters 31 connected in cascade. Dividers 19, 23 and 27 assist the filters in cleaning up the signal by removing the desired frequency from the vicinity of the unwanted sidebands. The dividers may include locked oscillators which accomplish further filtering by locking on only one frequency. Selectors 17, 21, 25 and 29 are connected to mixers 18, 22, 26 and 30 of digit control sections 14, 15, 16 and 17, respectively.

It is noted that digit control sections 14 to 16 are identical in construction and operation and can be used interchangeably. Digit control section 17 is constructed identical to the other control sections with the exception that the divider is omitted. In the embodiment disclosed below the control sections are 1-cycle, 10-cycle, 100-cycle, and 1000-cycle control sections. Additional identical units may be added to produce increments in steps as small or as great as desired in any selected range of frequencies.

In the operation of the embodiment shown in FIGS. 1 and 2, the output of standard signal source 10 is applied to signal generator 11 to 13 to derive output signals having values equal to $f_{1\ \mathrm{low}}$ to $f_{1\ \mathrm{high}}$ with $\Delta f$ separation, $$f \text{ and } f - \frac{f + f_{1\ \mathrm{low}}}{x}$$

respectively, where X may be any selected divisor. The output signal of signal generator 11 is applied in parallel to selectors 17, 21, 25, and 29, at each of which a signal equal to $f_{1\ \mathrm{low}} + N\Delta f$ may be selected, where N is equal to any selected number. Considering the operation of digit control 14, assume that selector 17 is set so that the output signal, which is applied to mixer and tuned filters 18, is equal to $f_{1\ \mathrm{low}} + N\Delta f$. The output signal $f$ of signal generator 12 is applied to the mixer and tuned filters 18 to provide a signal equal to $f_{1\ \mathrm{low}} + N\Delta f + f$ (the two applied signals are added to the mixer) which is applied to and divided by X in divider 19 to obtain $$\frac{f_{1\ \mathrm{low}} + N\Delta f + f}{X}$$

The latter signal is applied to mixer and tuned filters 20 where is added to the output of signal generator 13, $$f-\frac{f+f_{1\,\text{low}}}{X}$$

to obtain an output signal for digit control section 14 equal to $$f+\frac{N\Delta f}{X}$$

which is fed to mixer and tuned filters 22 in digit control section 15.

As indicated by the various formulae shown in FIGS. 1 and 2, the operation of digit control sections 15 and 16 is identical to that of digit control section 14, described immediately above. It is noted that the output of digit control section 15, which is equal to $$f+\frac{N'f}{X}+\frac{N\Delta f}{X^2}$$

is applied to mixer and tuned filters 26 in digit control section 16 and that the output of digit control section 16, $$f+\frac{N''\Delta f}{X}+\frac{N'\Delta f}{X^2}+\frac{N\Delta f}{X^3}$$

is applied to mixer and tuned filters 30 in digit control section 17.

In the operation of digit control section 17, selector 29 is set to provide a signal equal to $f_{1\,\text{low}}+N'''\Delta f$, where N''' may be any selected number, which is applied to mixer and tuned filters 30 and added therein to the output of mixer and tuned filters 28 to provide $$f+f_{1\,\text{low}}+N'''\Delta f+\frac{N''\Delta f}{X}+\frac{N'\Delta f}{X^2}+\frac{N\Delta f}{X^3}$$

The signal $f_2$ provided by signal generator 32 is applied to mixer and tuned filters 31 where it is subtracted from the output of mixer and tuned filters 30 to obtain $$f+f_{1\,\text{low}}+N'''\Delta f+\frac{N''\Delta f}{X}+\frac{N'\Delta f}{X^2}+\frac{N\Delta f}{X^3}-f_2$$

as the output of the frequency synthesizer disclosed in FIGS. 1 and 2. It is, of course, understood that if desired in certain applications the output of signal generator 32 could be added to instead of subtracted from the output of mixer and tuned filters 30.

In a typical example of the operation of the embodiment shown in FIGS. 1 and 2:

Let: $x$=base 10

$f_{1\,\text{low}}$=100 kc. $f_{1\,\text{high}}$=200 kc. $\Delta f$=10 kc.

$f$=900 kc. $f_2$=1,000 kc.

Then $$f-\frac{f+f_{1\,\text{low}}}{X}=900-\frac{900+100}{10}=800\text{ kc.}$$

It will be noted that the sum of (900 kc.) plus $f_{1\,\text{low}}$ (100 kc.) totals 1 mc. ($10^6$ cycles) and that $x$ equals 10.

If it is desired to generate a signal equal to 43.21 kc., selectors 17, 21, 25 and 29 are set at 1, 2, 3, and 4, respectively.

In digit control section 14, selector 17 provides a signal equal to 110 kc. which is applied to mixer and tuned filters 18 where it is added to 900 kc. to obtain 1010 kc. The last mentioned signal in turn is divided by 10 in divider 19 and added to 800 in mixer and tuned filters 20 to provide 901 kc. as the output of digit control section 14. Similarly, in digit control section 15, a signal having a frequency equal to 120 kc. (output of selector 21) is added to 901 (output of mixer and tuned filters 20) to provide 1021 which is divided by 10 and then added to 800 to obtain 902.1 kc. as the output of the digit control section. Likewise, in digit control section 16, a signal equal to 130 kc. is added to 902.1 to obtain 1032.1 which is divided by 10 and added to 800 to derive 903.21 as the output signal of the digit control section. In digit control section 17, a 140 kc. signal is added to 903.21 kc. in mixer and tuned filters 30 to develop 1043.21 kc. from which 1000 kc. is subtracted in mixer and tuned filters 31 to provide the desired 43.21 kc. as the output of the frequency synthesizer.

It is understood that any other desired frequency may be derived in a manner quite analogous to that explained above in connection with the specific 43.21 kc.

While there has been described hereinabove what is at present considered to be a preferred embodiment of this invention, it will be obvious to those skilled in the art that various changes and modifications may be made therein without departing from the scope and spirit of the invention.

What is claimed is:

1. A frequency synthesizer for providing output signals at selected frequencies within a selected frequency band, as desired, comprising first signal generating means having an output at a selected frequency $f_1$; second signal generating means having a multifrequency output at a selected frequency $f_2$ and at selected constant frequency intervals $\Delta f$ within the frequency range $f_2$ to $f_2+N\Delta f$ where $n$ is an integer representative of the number of frequency intervals; third signal generating means having an output at a selected frequency $f_3$; a frequency standard source; means connecting said frequency standard source to each of said first, second and third signal generating means such that the outputs thereof are stabilized in phase with the output of said frequency standard source; a plurality of digit control sections, each of said digit control sections in said plurality thereof comprising at least a first mixer, a divider for dividing an input signal by a selected base factor $x$, where $x$ is an integer and a second mixer connected in cascade; means connecting said plurality of digit control sections in cascade; means connecting the output of said first signal generating means to said first mixer of the digit control section in said cascade connection thereof; a plurality of selector means connected to the output of said second generating means and adapted for the selection of frequencies at said selected intervals $\Delta f$ within the frequency range $f_2$ to $f_2+n\Delta f$, where $f_2$ is a fraction of $f_1$, such that $f_1+f_2$ is an exponential function of said base factor, $x$; means connecting different selector means in said plurality thereof to one of said first and second mixers in each of said digit control sections; means connecting the output of said third signal generating means, $f_3$, to the other of said first and second mixers in each of said digit control sections in said plurality thereof, said $f_3$ being equal to $$f_1-\frac{f_1+f_2}{x}$$

output means; and means connecting said output means to the output of the last digit control section in said cascade connected plurality thereof.

2. The device as defined in claim 1 wherein $x$, the base factor of said divider in each of said digit control sections, is an integer exponential function of 10.

3. The device as defined in claim 1 wherein $x$, the base factor of said divider in each of said digit control sections, is 10.

4. The device as defined in claim 1 wherein said output means comprises a third mixer; a fourth signal generating means having an output at a selected frequency $f_4$; means connecting the output of said fourth signal generating means to said third mixer; and means connecting said standard frequency source to said fourth signal generating means such that the output thereof is stabilized in phase with the output of said standard frequency source.

5. The device defined in claim 3 wherein said output means comprises a third mixer; a fourth signal generating means having an output at a selected frequency $f_4$; means connecting the output of said fourth signal generating means to said third mixer; and means connecting said standard frequency source to said fourth signal generating means such that the output thereof is stabilized in phase with the output of said standard frequency source.

6. The device as defined in claim 1 wherein said first mixer, said divider and said second mixer are connected in cascade in the order named.

7. The device as defined in claim 3 wherein said first mixer, said divider and said second mixer are connected in cascade in the order named.

8. The device as defined in claim 5 wherein said first mixer, said divider and said second mixer are connected in cascade in the order named.

References Cited in the file of this patent

UNITED STATES PATENTS

| | | |
|---|---|---|
| 2,829,255 | Bolie | Apr. 1, 1958 |
| 2,845,538 | Havens | July 29, 1958 |

FOREIGN PATENTS

| | | |
|---|---|---|
| 148,412 | Australia | Sept. 29, 1952 |